United States Patent
Li

(10) Patent No.: US 12,062,659 B2
(45) Date of Patent: Aug. 13, 2024

(54) FinFET STANDARD CELL WITH DOUBLE SELF-ALIGNED CONTACTS AND METHOD THEREFOR

(71) Applicant: SHANGHAI HUALI INTEGRATED CIRCUIT CORPORATION, Shanghai (CN)

(72) Inventor: Yong Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 428 days.

(21) Appl. No.: 17/522,781

(22) Filed: Nov. 9, 2021

(65) Prior Publication Data

US 2023/0051161 A1  Feb. 16, 2023

(30) Foreign Application Priority Data

Aug. 12, 2021 (CN) .......................... 202110925167.9

(51) Int. Cl.
*H01L 27/088* (2006.01)
*H01L 21/8234* (2006.01)
*H01L 29/66* (2006.01)
*H01L 29/78* (2006.01)

(52) U.S. Cl.
CPC .. *H01L 27/0886* (2013.01); *H01L 21/823418* (2013.01); *H01L 21/823431* (2013.01); *H01L 29/66795* (2013.01); *H01L 29/7851* (2013.01)

(58) Field of Classification Search
CPC ......... H01L 27/0886; H01L 21/823418; H01L 21/823431; H01L 29/66795; H01L 29/7851; H01L 21/823475; H01L 29/785; H01L 29/665
See application file for complete search history.

(56) References Cited

U.S. PATENT DOCUMENTS

2021/0066489 A1* 3/2021 Xie ........................ H01L 29/785

* cited by examiner

*Primary Examiner* — Karen Kusumakar
*Assistant Examiner* — Adam S Bowen
(74) *Attorney, Agent, or Firm* — Banner & Witcoff, Ltd.

(57) ABSTRACT

The present disclosure describes a fin field-effect transistor (FinFET) standard cell with double self-aligned contacts. The FinFET standard cell with double self-aligned contacts includes a self-aligned gate contact spanning over a diffusion bonding hole and a self-aligned diffusion bonding hole contact spanning over a gate, and the FinFET device further includes a cap layer between the two self-aligned contacts so as to separate the two self-aligned contacts, thereby further reducing the size of the active fin or a dummy fin so as to further reduce the area of the FinFET standard cell, to prevent a bridge connection between adjacent M0 structures like the M0A and M0P, thereby improving yield of manufacturing.

6 Claims, 5 Drawing Sheets

FinFET STANDARD CELL WITH DOUBLE SELF-ALIGNED CONTACTS AND METHOD THEREFOR

CROSS-REFERENCES TO RELATED APPLICATION

This application claims the priority to Chinese patent application No. CN202110925167.9, filed on Aug. 12, 2021 at CNIPA, and entitled "FinFET Standard Cell with Double Self-aligned Contacts and Method Therefor", the disclosure of which is incorporated herein by reference in entirety.

TECHNICAL FIELD

The present disclosure relates to a semiconductor integrated circuit manufacturing technology, and particularly relates to a fin field-effect transistor (FinFET) standard cell with double self-aligned contacts.

BACKGROUND

A novel complementary metal oxide semiconductor transistor is named as a fin field-effect transistor for its fin shape. The fin shape is conducive to improvement of circuit control, reduction of the leakage current of the transistor, and smaller gate length of the transistor.

FIG. 1 shows a schematic top view of a NOR flash fin field-effect transistor (FinFET) standard cell. As shown in FIG. 1, the fin field-effect transistor standard cell may be of a multi-layer structure including fins and polysilicon 13 in sequence from bottom to top, where the fins are divided into active fins 11 in active fin regions and dummy fins 12 in a dummy fin region, which separates the two adjacent active fin regions. The fin field-effect transistor standard cell further includes a metal 0 layer which includes M0A 14 and M0P 15, where the active fins 11 in the active fin regions are connected together through M0A 14, and M0A 14 is connected to a metal layer 16 through a contact hole layer.

The area A of the fin field-effect transistor standard cell shown in FIG. 1 satisfies the equation: A=Cell.H*Cell.W, where Cell.W is the width of the fin field-effect transistor standard cell, and Cell.H is the length of the fin field-effect transistor standard cell. Development of a semiconductor technology promotes miniaturization of devices. In order to reduce the area of the fin field-effect transistor standard cell, the conventional double diffusion break (DDB) process has been changed to the single diffusion break (SDB) process to reduce the size of the active fin 11 or the size of the dummy fin 12. However, at least two dummy fins 12 are required between the two adjacent active fin regions, because otherwise, M0A 14 might be in bridge connection with M0P 15 due to an over small spacing between them, so as to affect the properties of the devices. Therefore, how to reduce the area of the fin field-effect transistor standard cell in the prior art remains to be a technical problem to be solved.

SUMMARY

The present disclosure provides a fin field-effect transistor (FinFET) standard cell with double self-aligned contacts. The disclosed FinFET standard cell with double self-aligned contacts includes: a semiconductor substrate, on which a first metal gate and two second metal gates at one side of the first metal gate are formed, where a diffusion bonding hole and a diffusion bonding hole filling plug cap above the diffusion bonding hole separate the two second metal gates; a self-aligned gate contact spanning over a diffusion bonding hole, which connects the two second metal gates and spans the diffusion bonding hole filling plug cap between the two second metal gates; a self-aligned diffusion bonding hole contact spanning over a gate, which connects the diffusion bonding holes on two sides of the first metal gate and spans the first metal gate; and a buffer layer side wall, which is located between the self-aligned gate contact spanning over a diffusion bonding hole and the self-aligned diffusion bonding hole contact spanning over a gate so as to separate the self-aligned gate contact spanning over a diffusion bonding hole and the self-aligned diffusion bonding hole contact spanning over a gate.

Further, the diffusion bonding hole filling plug cap is made of an insulation material.

Further, the standard cell further includes a layer of diffusion bonding hole filling plug cap between the self-aligned diffusion bonding hole contact spanning over the gate and the buffer layer side wall.

Further, the material of the self-aligned gate contact spanning over a diffusion bonding hole and the material of the self-aligned diffusion bonding hole contact spanning over a gate include tungsten or cobalt.

The present disclosure further provides a formation method for the FinFET standard cell with double self-aligned contacts, which includes: S11, forming metal gates of the FinFET standard cell with double self-aligned contacts, and carrying out planarization, where a first interlayer dielectric layer separates the adjacent metal gates; S12, forming a buffer layer to cover the metal gates and the first interlayer dielectric layer; S13, removing part of the buffer layer and the first interlayer dielectric layer between the metal gates, and forming a conductive material in regions where the first interlayer dielectric layer and part of the buffer layer are removed, so as to form a diffusion bonding hole; S14, etching a diffusion bonding hole filling plug to remove part of the conductive material in the diffusion bonding hole and reserving part of the conductive material, so as to form a hole on the remaining conductive material; S15, forming a cap layer, and carrying out planarization to fill the hole with the cap layer, so as to form a diffusion bonding hole filling plug cap; S16, carrying out etching to remove part of the buffer layer on a first metal gate, so as to cover a top of the first metal gate with the remaining buffer layer, removing the diffusion bonding hole filling plug caps on two sides of the first metal gate until the conductive materials under the diffusion bonding hole filling plug caps are exposed, and forming a first groove in regions where the buffer layer and the diffusion bonding hole filling plug caps are removed; S17, carrying out etching to remove part of the buffer layer on top of the two second metal gates at one side of the first metal gate until the second metal gates under the buffer layer are exposed, reserving a buffer layer side wall close to one side of the first metal gate, removing part of diffusion bonding hole filling plug cap between the two second metal gates, so as to cover the diffusion bonding hole obtained after etching with the remaining diffusion bonding hole filling plug cap, forming a second groove in regions where the buffer layer and the diffusion bonding hole filling plug cap are removed, and separating the first groove from the second groove by means of the buffer layer side wall; and S18, forming conductive materials, filling the first groove and the second groove with the conductive materials, connecting the two second metal gates by means of the conductive material, connecting, by means of the conductive material, the diffusion bonding holes obtained after etching on two sides of the first metal gate, and separating the conductive materials in the first groove and the second groove by means of the buffer layer side wall.

Further, the forming metal gates of the FinFET standard cell with double self-aligned contacts includes: providing a semiconductor substrate, forming a plurality of fins, which are arranged in parallel, on the semiconductor substrate, and forming insulation layers at bottoms of the fins so as to separate the fins; forming a plurality of polysilicon gate rows which are arranged in parallel, where length directions of the plurality of polysilicon gate rows are perpendicular to length directions of the plurality of fins, forming dummy gate structures in crossing regions of the plurality of polysilicon gate rows and the plurality of fins, forming source regions or drain regions on two sides of the dummy gate structure on each fin, forming embedded epitaxial layers in the source regions or the drain regions, and sequentially forming side walls on surfaces of the source regions or the drain regions; forming first interlayer dielectric layers to fill gaps between the plurality of polysilicon gate rows and the plurality of fins on the semiconductor substrate and to cover the dummy gate structures; and removing polysilicon gates at the dummy gate structures, and forming metal gates in regions where the polysilicon gates are removed, so as to form the metal gates of the FinFET standard cell with double self-aligned contacts.

Further, the buffer layer is formed through a deposition process.

Further, the buffer layer is made of the same material as the first interlayer dielectric layer.

Further, the cap layer is made of an insulation material.

Further, in step S16, a layer of diffusion bonding hole filling plug cap remains on a side wall of the first groove.

DETAILED DESCRIPTION OF THE EMBODIMENTS

Figure 1:
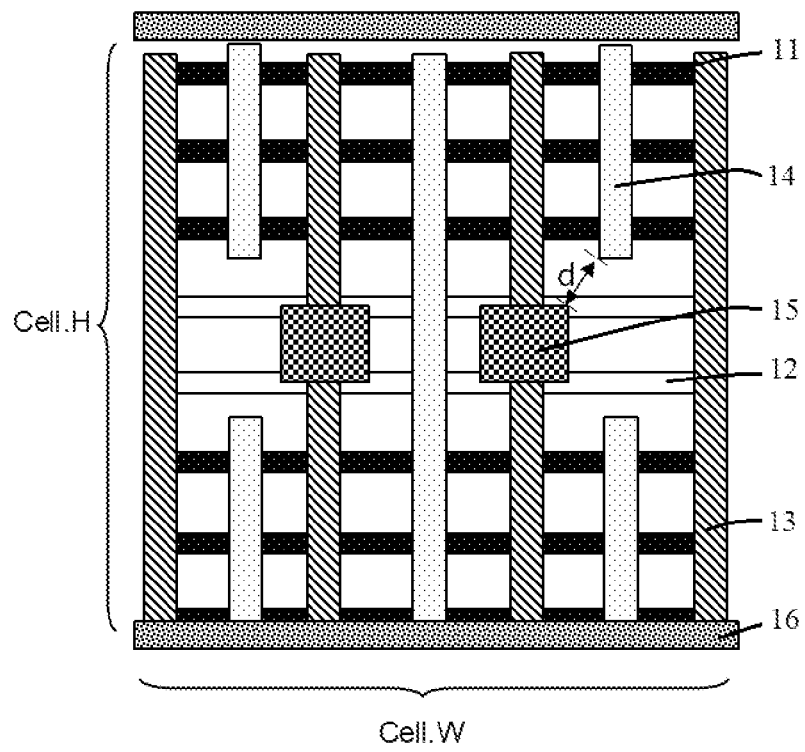
FIG. 1 shows a schematic diagram of a top view of a NOR flash fin field-effect transistor (FinFET) standard cell.

The present disclosure will be clearly and completely described below with reference to the accompanying drawings. Obviously, the described embodiments are merely a part rather than all of the embodiments of the present disclosure. All other embodiments obtained by a person of ordinary skill in the art on the basis of the embodiments of the present disclosure without creative efforts shall fall within the protection scope of the present disclosure.

It should be understood that the present disclosure may be implemented in different forms but should not be construed as being only limited to the embodiments herein. On the contrary, these embodiments are provided to make disclosure thorough and complete, and to fully convey the scope of the present disclosure to a person skilled in the art. In the accompanying drawings, the size and relative size of layers and regions may be exaggerated for clarity, and the same reference numeral indicates the same element throughout. It should be understood that when an element or layer is "above", "adjacent to", "connected to" or "coupled to" other elements or layers, it may be directly above, adjacent to, connected to or coupled to other elements or layers, or intervening elements or layers may be present. On the contrary, when an element is "directly above", "directly adjacent to", "directly connected to" or "directly coupled to" other elements or layers, there are no intervening elements or layers. It should be understood that although terms such as first, second and third may be used to describe various elements, components, regions, layers and/or portions, these elements, components, regions, layers, and/or portions should not be limited by these terms. These terms are merely used to distinguish one element, component, region, layer or portion from another element, component, region, layer or portion. Therefore, without departing from the teachings of the present disclosure, a first element, component, region, layer or portion discussed below may be represented as a second element, component, region, layer or portion.

Spatial relationship terms such as "under", "at a lower portion of . . . ", "lower", "below", "above" and "upper" may be used herein to conveniently describe relationships between one element or feature and other elements or features shown in the accompanying drawings. It should be understood that the spatial relationship terms are intended to encompass different orientations of devices in use and operation in addition to the orientations shown in the accompanying drawings. For example, if the devices in the accompanying drawings are turned over, then the element or feature described as being "at a lower portion of", "below" or "under" other elements or features will be oriented "above" other elements or features. Thus, the exemplary terms "at a lower portion of . . . " and "lower" may include both upper and lower orientations. The devices may be otherwise oriented (rotated by 90 degrees or otherwise) and the spatial descriptors used herein are interpreted accordingly.

The terms used herein only aim to describe the specific embodiments but not to limit the present disclosure. As used herein, singular forms "a", "one" and "the" are also intended to include plural forms unless the context clearly dictates other forms. It should also be understood that terms "comprise" and/or "include", when used in this description, determine the presence of stated features, integers, steps, operations, elements, and/or components, but do not preclude the presence or addition of one or more other features, integers, steps, operations, elements, components, and/or groups. As used herein, a term "and/or" includes any combinations of the related listed items.

The present disclosure provides a method for reducing areas of a fin field-effect transistor (FinFET) standard cell with double self-aligned contacts. FIGS. 2-9 show the schematic cross sectional views at various steps of the method in forming of the FinFET standard cell with double self-aligned contacts structure, according to one embodiment of the present disclosure. The method includes the following steps:

S11, form metal gates of the FinFET standard cell with double self-aligned contacts, and carry out planarization, where a first interlayer dielectric layer separates the adjacent metal gates.

Figure 2:
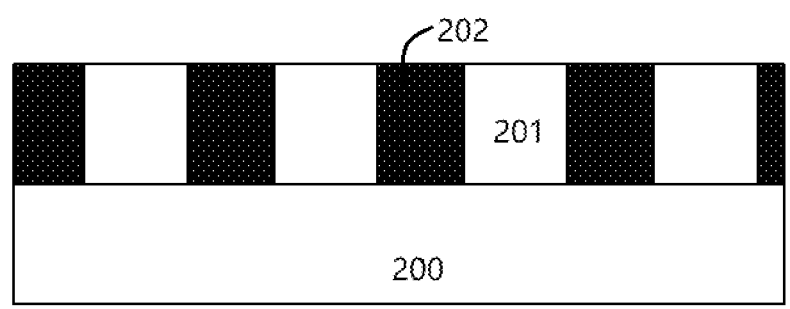
FIGS. 2-9 show schematic cross sectional views at various steps in forming the FinFET standard cell with double self-aligned contacts structure, according to one embodiment of the present disclosure.

Specifically, with reference to FIG. 2, the first interlayer dielectric layer 202 separates from the adjacent metal gates 201.

Specifically, the step of forming metal gates of the FinFET standard cell with double self-aligned contacts includes:

provide a semiconductor substrate 200, forming a plurality of fins, which are arranged in parallel, on the semiconductor substrate 200, and form insulation layers at bottoms of the fins so as to separate the fins;

form a plurality of polysilicon gate rows which are arranged in parallel, where length directions of the plurality of polysilicon gate rows are perpendicular to length directions of the plurality of fins, form dummy gate structures in crossing regions of the plurality of polysilicon gate rows and the plurality of fins, form source regions or drain regions on two sides of the dummy gate structure on each fin, form embedded epitaxial layers in the source regions or the drain regions, and sequentially form side walls on surfaces of the source regions or the drain regions;

form first interlayer dielectric layers 202 to fill gaps between one of the plurality of polysilicon gate rows and one of the plurality of fins on the semiconductor substrate. and the first interlayer dielectric layers 202 cover the dummy gate structures; and remove polysilicon gates at the dummy gate structures, and form metal gates in regions where the polysilicon gates are removed, so as to prepare for the metal gates of the FinFET standard cell with double self-aligned contacts.

S12, form a buffer layer to cover the metal gates and the first interlayer dielectric layer.

Figure 3:
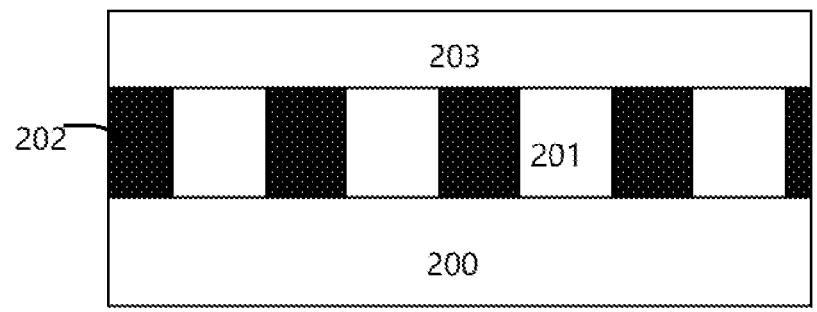

Specifically, with reference to FIG. 3, the buffer layer 203 covers the metal gates 201 and the first interlayer dielectric layer 202.

In one example, the buffer layer 203 is formed through a deposition process. In one example, the buffer layer 203 is made of the same material as the first interlayer dielectric layer 202.

S13, remove the first interlayer dielectric layer and part of the buffer layer between the metal gates, and dispose a conductive material in regions where the first interlayer dielectric layer and part of the buffer layer are removed, so as to form a diffusion bonding hole.

Figure 4:
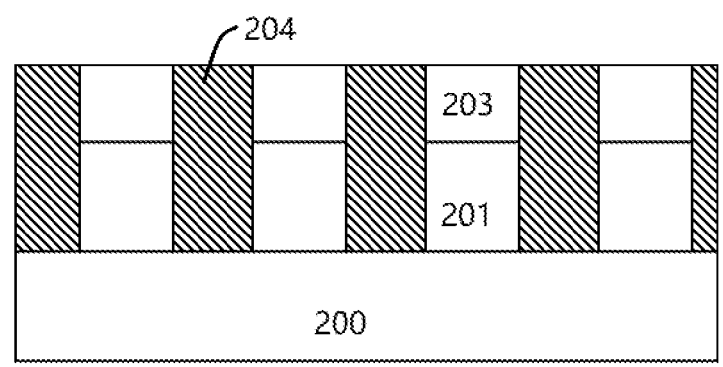

As shown in FIG. 4, part of the buffer layer 203 and the first interlayer dielectric layer 202 between the metal gates 201 are removed, and the conductive material is formed in regions where the first interlayer dielectric layer 202 and part of the buffer layer 203 are removed, so as to form the diffusion bonding hole 204.

S14, etch a diffusion bonding hole filling plug to remove part of the conductive material in the diffusion bonding hole, and leaving the lower part of the conductive material intact, so as to form a hole in the remaining conductive material.

Figure 5:
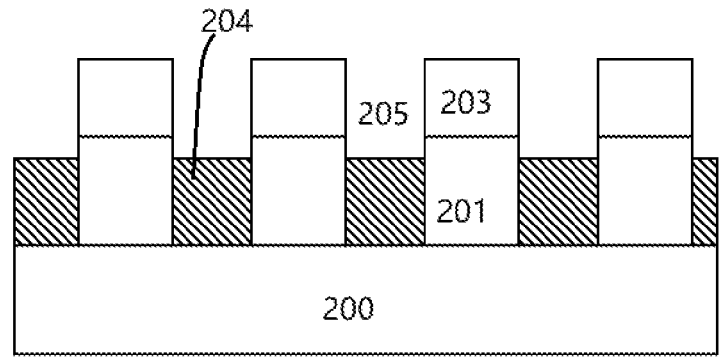

As shown in FIG. 5, part of the conductive material in the diffusion bonding hole 204 is removed by etching and part of the conductive material is reserved, so as to form the hole 205 on the remaining conductive material.

S15, form a cap layer, and carry out planarization on the top surface to fill the hole with the cap layer, so as to form a diffusion bonding hole filling plug cap.

Figure 6:
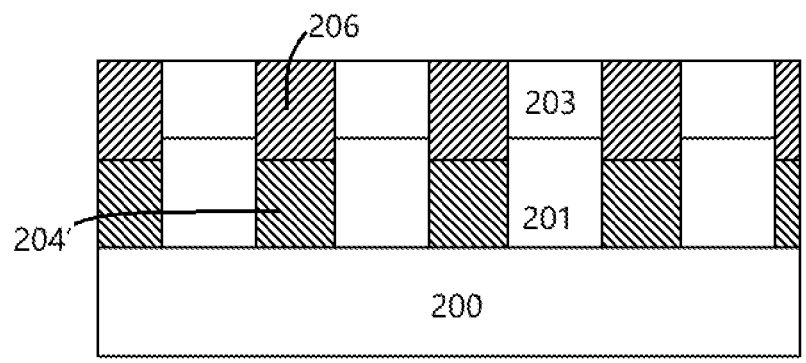

As shown in FIG. 6, the hole is filled with the diffusion bonding hole filling plug cap 206, and the remaining conductive material forms the diffusion bonding hole 204' obtained after etching.

In one example, the cap layer is made of an insulation material.

S16, etch to remove part of the buffer layer on a first metal gate, so as to cover a top of the first metal gate with the remaining buffer layer, remove the diffusion bonding hole filling plug caps on two sides of the first metal gate until the conductive material under the diffusion bonding hole filling plug caps are exposed, and form a first groove in regions where the buffer layer and the diffusion bonding hole filling plug caps are removed.

Figure 7:
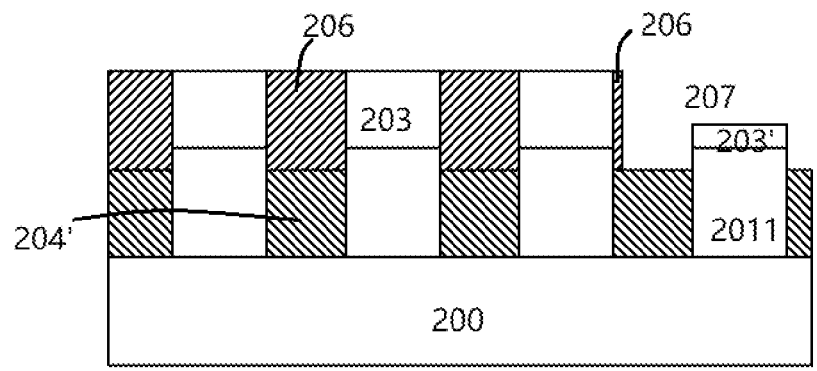

As shown in FIG. 7, part of the buffer layer 203 on the first metal gate 2011 is removed, so that the remaining buffer layer 203' covers the top surface of the first metal gate 2011, as a result, portions of the diffusion bonding hole filling plug caps 206 on two sides of the first metal gate 2011 are also removed and the conductive materials are exposed from under the diffusion bonding hole filling plug caps 206, thus forming the first groove 207 in regions where the buffer layer and the diffusion bonding hole filling plug caps are removed from.

As an example, in step S16, a portion of the diffusion bonding hole filling plug cap 206 still remains at least on one side wall of the first groove 207.

S17, carry out etching to remove a part of the buffer layer on top of the two second metal gates at one side of the first metal gate to expose the second metal gates from under the buffer layer, leaving a buffer layer side wall close to the first groove that sits next to one side of the first metal gate, also remove an upper portion of the diffusion bonding hole filling plug cap which is located between the two second metal gates, therefore the remaining diffusion bonding hole filling plug cap covers the diffusion bonding hole obtained after etching, a second groove is formed in the regions where the buffer layer and the diffusion bonding hole filling plug cap are removed from, as a result, the first groove is separated from the second groove by means of a buffer layer side wall.

Figure 8:
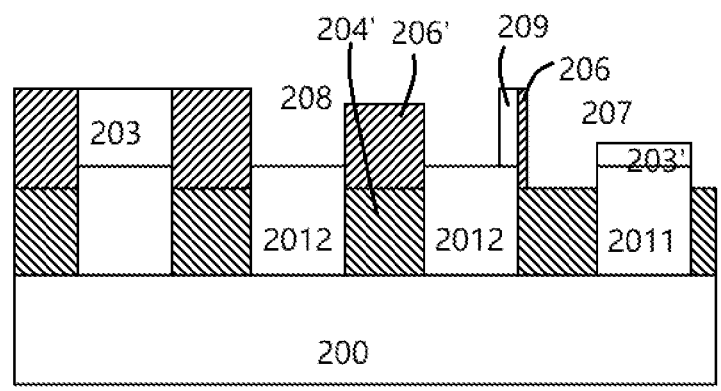

As shown in FIG. 8, a part of the buffer layer 203 on top of the two second metal gates 2012 at one side of the first metal gate 2011 is removed to expose the second metal gates 2012 from under the buffer layer, a buffer layer side wall 209 remains in the vicinity of one side of the first metal gate 2011, an upper part of the diffusion bonding hole filling plug cap between the two second metal gates 2012 is removed, such that the remaining diffusion bonding hole filling plug cap 206' covers the diffusion bonding holes 204' obtained after etching, in addition, the second groove 208 is formed in the regions where part of the buffer layer and the diffusion bonding hole filling plug cap are removed from, thus the first groove 207 is separated from the second groove 208 by means of a buffer layer side wall 209.

S18, fill the first groove and the second groove with a conductive material such that the two second metal gates are connected by a layer of the conductive material, also connected are the diffusion bonding holes obtained after etching on two sides of the first metal gate. However, the layer of the conductive material in the first groove and in the second groove is separated by means of the buffer layer side wall.

Figure 9:
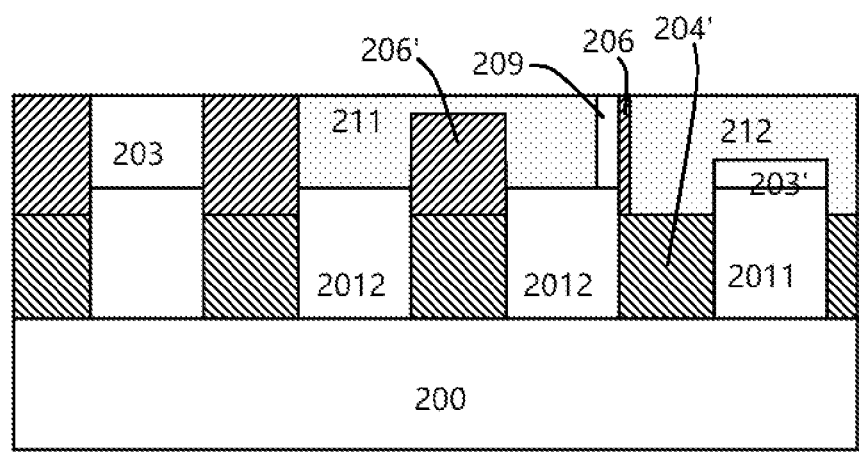

As shown in FIG. 9, the first groove 207 and the second groove 208 (in FIG. 8) are filled with the conductive material 211, the two second metal gates 2012 are connected by means of the conductive material 211, the diffusion bonding holes 204' obtained after etching at the two sides of the first metal gate 2011 are connected by means of the conductive material 212, and the conductive material in the first groove 207 and the second groove 208 are separated by means of the buffer layer side wall 209.

In one example, the conductive material is tungsten (W) or cobalt (Co).

The part of the conductive material spanning over a diffusion bonding hole becomes the self-aligned gate contact 211 spanning over which connects the two second metal gates 2012. The conductive material that connects the diffusion bonding holes obtained after etching on two sides of the first metal gate 2011 forms the self-aligned diffusion contact 212 which spans the first metal gate 2011.

In this way, the FinFET standard cell with double self-aligned contacts are formed, where one of the self-aligned contact is the self-aligned gate contact spanning over one diffusion bonding hole, and the other one is the self-aligned diffusion bonding hole contact spanning over one gate. After the diffusion bonding hole is fabricated, the diffusion bonding hole filling plug is etched, and the cap layer is formed in the hole formed by etching to separate the two self-aligned contacts, thereby further reducing the size of an active fin or a dummy fin so as to further reduce the area of the FinFET standard cell occupies, and preventing the bridge connection between the adjacent MOA and MOP structures so as to improve yields of the device manufacturing.

One embodiment of the present disclosure provides a method to fabricate a FinFET standard cell with double self-aligned contacts, which enables reducing an area of the FinFET standard cell takes.

Another embodiment of the present disclosure provides a FinFET standard cell with double self-aligned contacts. With reference to a schematic diagram of the structure of the FinFET standard cell with double self-aligned contacts shown in FIG. 9, the FinFET standard cell includes: a semiconductor substrate 200, on which a first metal gate 2011 and two second metal gates 2012 at one side of the first metal gate are formed, where a diffusion bonding hole 204' and a diffusion bonding hole filling plug cap 206' above the diffusion bonding hole 204' separate the two second metal gates 2012; a self-aligned gate contact 211 spanning over a diffusion bonding hole, which connects the two second metal gates 2012 and spans the diffusion bonding hole filling plug cap 206' between the two second metal gates 2012; a self-aligned diffusion bonding hole contact 212 spanning over a gate, which connects the diffusion bonding holes 204' on two sides of the first metal gate 2011 and spans the first metal gate 2011; and a buffer layer side wall 209, which is located between the self-aligned gate contact 211 spanning over a diffusion bonding hole and the self-aligned diffusion bonding hole contact 212 spanning over a gate so as to separate the self-aligned gate contact 211 spanning over a diffusion bonding hole and the self-aligned diffusion bonding hole contact 212 spanning over a gate.

In one example, the diffusion bonding hole filling plug cap 206' is made of an insulation material.

In one example, the standard cell further includes a layer of diffusion bonding hole filling plug cap 206 between the self-aligned diffusion bonding hole contact 212 spanning over a gate and the buffer layer side wall 209.

In one example, the self-aligned gate contact 211 spanning over a diffusion bonding hole and the self-aligned diffusion bonding hole contact 212 spanning over a gate are made of tungsten (W) or cobalt (Co).

In this way, the FinFET standard cell with double self-aligned contacts includes the self-aligned gate contact spanning over a diffusion bonding hole and the self-aligned diffusion bonding hole contact spanning over a gate, and further includes the cap layer between the two self-aligned contacts so as to separate the two self-aligned gates, thereby further reducing a size of an active fin or a dummy fin so as to further reduce an area of the FinFET standard cell, and preventing a bridge connection between adjacent MOA and MOP so as to improve properties of devices.

One embodiment of the present disclosure provides a formation method for the FinFET standard cell with double self-aligned contacts shown in FIG. 9, which is the same as the method for reducing an area of a FinFET standard cell with double self-aligned contacts described above and will not be described in detail herein.

Finally, it should be noted that the above-mentioned embodiments are merely intended for describing the technical solutions of the present disclosure rather than limiting the present disclosure. Although the present disclosure is described in detail with reference to the above-mentioned embodiments, a person of ordinary skill in the art should understand that they may still make modifications to the technical solutions described in the embodiments or equivalent substitutions to some or all of the technical features of the technical solutions. These modifications or substitutions do not enable the corresponding technical solutions to depart from the scope of the technical solutions in all the embodiments of the present disclosure.

What is claimed is:

1. A method of forming a fin field-effect transistor (FinFET) standard cell with double self-aligned contacts, comprising steps of:

S11, forming a first metal gate and two second metal gates of the FinFET standard cell, and carrying out planarization, wherein the two second metal gates are placed at one side of the first metal gate, forming a first interlayer dielectric layer to separate between any two of the second metal gates and the first metal gate;

S12, forming a buffer layer to cover the first metal gate and the two second metal gates and the first interlayer dielectric layer;

S13, removing a part of the buffer layer and the first interlayer dielectric layer between any two of the second and first metal gates, and filling a conductive material in regions where the first interlayer dielectric layer and the part of the buffer layer are removed from, so as to form diffusion bonding holes;

S14, etching diffusion bonding hole filling plugs to remove part of the conductive material from the diffusion bonding holes and keeping part of the conductive material, so as to form holes on the remaining conductive material;

S15, forming a cap layer, and carrying out planarization to fill the holes with the cap layer, so as to form diffusion bonding hole filling plug caps;

S16, performing etching to remove a part of the buffer layer on the first metal gate, wherein the remaining buffer layer covers a top of the first metal gate, removing the diffusion bonding hole filling plug caps from two sides of the first metal gate until the conductive material under the diffusion bonding hole filling plug caps is exposed, and forming a first groove in regions where the buffer layer and the diffusion bonding hole filling plug caps are removed from;

S17, performing etching to remove part of the buffer layer from above the two second metal gates located at one side of the first metal gate until the second metal gates under the buffer layer are exposed, keeping a buffer layer side wall close to the one side of the first metal gate, removing part of a first diffusion bonding hole filling plug cap between the two second metal gates, so as to cover the first diffusion bonding hole obtained after etching with the remaining first diffusion bonding hole filling plug cap, forming a second groove in regions where the buffer layer and the first diffusion bonding hole filling plug cap are removed from, and separating the first groove from the second groove by means of the buffer layer side wall; and S18, filling the first groove and the second groove with the conductive material, wherein conductive material in the second groove connects the two second metal gates, wherein conductive material in the first groove connects second diffusion bonding holes obtained after etching at two sides of the first metal gate, and wherein the conductive material in the first groove and the conductive material in the second groove are separated in space by the buffer layer side wall.

2. The method of forming the FinFET standard cell with double self-aligned contacts according to claim 1, wherein the forming the first metal gate and the two second metal gates of the FinFET standard cell comprises:
    providing a semiconductor substrate, forming a plurality of fins arranged in parallel, on the semiconductor substrate, and
    forming insulation layers at bottoms of the plurality of fins so as to separate the fins;
    forming a plurality of polysilicon gate rows arranged in parallel, wherein length directions of the plurality of polysilicon gate rows are perpendicular to length directions of the plurality of fins;
    forming dummy gate structures in crossing regions of the plurality of polysilicon gate rows and the plurality of fins;
    forming source regions or drain regions on two sides of each fin of the dummy gate structures, forming embedded epitaxial layers in the source regions or the drain regions, and sequentially forming side walls on surfaces of the source regions or the drain regions;
    filling gaps between the plurality of polysilicon gate rows and the plurality of fins on the semiconductor substrate and covering the dummy gate structures with the first interlayer dielectric layer; and
    removing polysilicon gates from the dummy gate structures, and forming the first metal gate and the two second metal gates in regions where the polysilicon gates are removed from, to form metal gates of the FinFET standard cell.

3. The method of forming the FinFET standard cell with double self-aligned contacts according to claim 1, wherein the buffer layer is formed through a deposition process.

4. The method of forming the FinFET standard cell with double self-aligned contacts according to claim 1, wherein the buffer layer is made of a same material as the first interlayer dielectric layer.

5. The method of forming the FinFET standard cell with double self-aligned contacts according to claim 1, wherein the cap layer is made of an insulation material.

6. The method of forming the FinFET standard cell with double self-aligned contacts according to claim 1, wherein in step S16, a layer of diffusion bonding hole filling plug cap remains on a side wall of the first groove.

* * * * *